United States Patent [19]

Ohki

[11]  4,216,490
[45]  Aug. 5, 1980

[54] STATIC INDUCTION TRANSISTOR

[75] Inventor: Toshimi Ohki, Tokyo, Japan

[73] Assignee: Kabushiki Kaisha Daini Seikosha, Tokyo, Japan

[21] Appl. No.: 891,286

[22] Filed: Mar. 28, 1978

[30] Foreign Application Priority Data

Mar. 31, 1977 [JP] Japan ................... 52-36775

[51] Int. Cl.² .......................................... H01L 27/02
[52] U.S. Cl. ..................................... 357/43; 357/22;
357/89; 357/90; 357/92; 357/41
[58] Field of Search .................. 357/22, 23, 41, 43,
357/89, 90, 92

[56] References Cited

U.S. PATENT DOCUMENTS

| 4,067,036 | 1/1978 | Yoshida | 357/22 |
| 4,086,611 | 4/1978 | Nishizawa | 357/38 |
| 4,115,793 | 9/1978 | Nishizawa | 357/22 |

Primary Examiner—Martin H. Edlow
Attorney, Agent, or Firm—Robert E. Burns; Emmanuel J. Lobato; Bruce L. Adams

[57] ABSTRACT

A static induction transistor having a channel region between a gate region and a source region of the transistor. Current flowing from the drain region to the source region through the channel region is controlled by a voltage applied to the gate region. An impurity region having a conductivity type opposite that of the channel region is formed in the channel region and is effective to decrease the channel current which will flow when the gate region is biased by a low voltage.

6 Claims, 13 Drawing Figures

STATIC INDUCTION TRANSISTOR

BACKGROUND OF THE INVENTION

The present invention relates to static induction transistor logic (hereafter called SITL) used static induction transistors (hereafter called SIT).

SUMMARY OF THE INVENTION

It is an object of the invention to provide a new and improved static induction transistor (SIT) which consumes less power than a conventional SIT by decreasing the OFF current of the SIT.

The SIT according to the invention is a semiconductor device having a channel region formed between a drain region of the SIT and a source region of the SIT. A gate region is formed around the drain region and is responsive to a gate voltage applied thereto for controlling current flowing from the drain region to the source region through the channel region. An impurity is formed within the channel region and is effective to decrease the channel current when the gate region is biased with a low gate voltage, i.e. the impurity region is effective for decreasing the OFF current of the device. The impurity region has a conductivity type opposite that of the channel region.

DESCRIPTION OF THE PREFERRED EMBODIMENT

Figure 1:
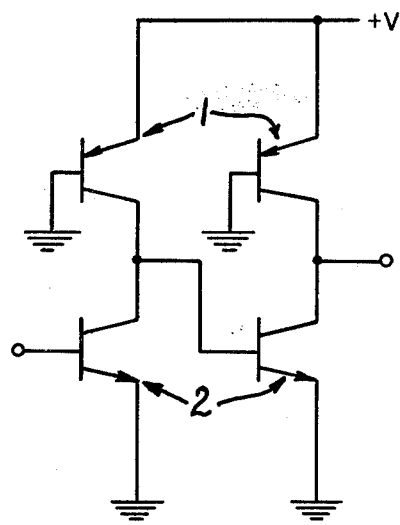
FIG. 1 is an equivalent circuit of two stage I$^2$L inverter.
Figure 2:
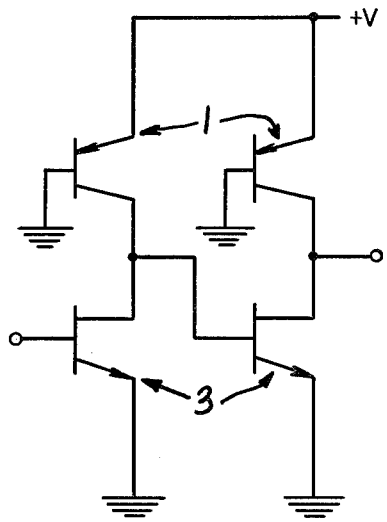
FIG. 2 is an equivalent circuit of two stage SITL inverter.
Figure 3:
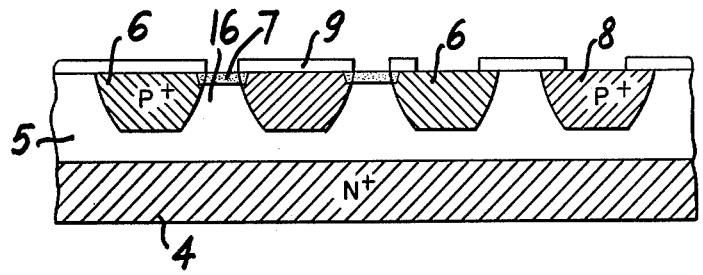
FIG. 3 is a sectional view of SITL structure.
Figure 4:
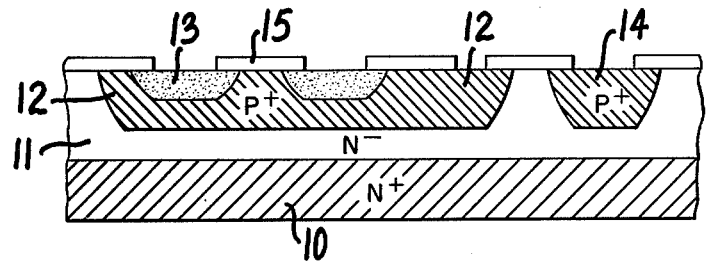
FIG. 4 is a sectional view of I$^2$L structure.

FIGS. 1 and 2 respectively show the equivalent circuits of two-step inverters of I$^2$L and static induction transistor logic, hereafter referred to as SITL. Both circuits have the same injector PNP transistor 1 but in the SITL an inverter is composed by using a N-channel SIT 3 instead of a vertical NPN transistor 2 of the I$^2$L. The sectional views of actual structures of SITL and I$^2$L shown in the FIGS. 2 and 1 are respectively shown in the FIGS. 3 and 4. The numerals 4 and 10 are N+ substrates, and 5 and 11 are N− epitaxial grown layers. The base of injector PNP transistor 1 is composed of 4 and 5 and also the N+ substrate 4 is used as the source of N channel SIT 3. The base of injector PNP transistor 1 and the emitter of NPN transistor 2 are composed of 10 and 11. Numerals 6, 12, 8 and 14 are P+ diffusion regions, wherein 6 acts as the collectors of PNP transistor 1 and the gate of N-channel SIT 3, 12 acts as the collector of PNP transistor 1 and the base of NPN transistor 2 and 8 and 14 act as the emitter of PNP transistor 1. Numerals 7 and 13 are N+ diffusion regions, wherein 7 acts as the drain of N-channel SIT 3, 13 acts as the collector of NPN transistor 2. Numerals 9 and 15 are oxide films.

Figure 5:
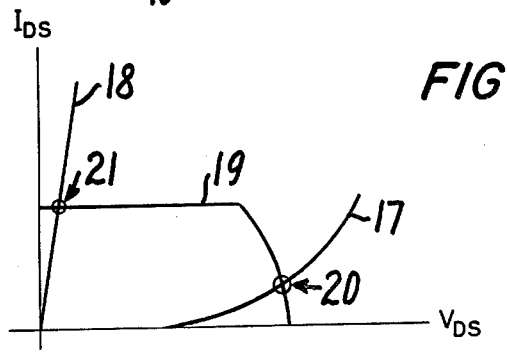
FIG. 5 is a characteristic diagram of SITL.

The operation of SITL will be described with reference to FIG. 5. Since the impurity concentration of epitaxial layer 5 is very low, normally about 10$^{13}$cm$^{-3}$, the channel region 16 of SIT has been already pinched off at the gate potential of 0.0 volts and the characteristics of the voltage V$_{DS}$ between drain and source and the current I$_{DS}$ flowing between drain and source exhibit the exponential function characteristics as represented by the curve "17". (It is called the SIT-mode.) And when the gate voltage (generally about 0.7 V) is applied to make the PN junction of the gate and source on, the electrons are injected from the source to the channel region and the V$_{DS}$–I$_{DS}$ characteristic rises sharply as shown by the curve 18. (It is called the charge injection mode.) Numeral 19 is the load-line of load PNP transistor 1 and, when the input voltage of the gate is zero ("0") level, the operating point is shown at 20 and the output voltage V$_{DS}$ turns to the "1" level and conversely, when input voltage is "1" level, the operating point is shown at 21 and the output voltage V$_{DS}$ turns to the "0" level.

As described above the operation of SITL is similar to that of I$^2$L. However, the SITL has a very large advantage in that the delay time thereof becomes smaller by one digit because the junction capacitance thereof is smaller by one digit in order to keep the impurity concentration of epitaxial layer 11 thereof smaller by two digits compared with that of I$^2$L. But when the gate voltage is zero ("0") level, I$_{DS}$ exhibits the exponential characteristic (it is called the OFF-current) so that it sometimes happens that an unexpected large OFF-current flows in response to fluctuations across-the-channel, the impurity concentrations of P+ diffusion regions and channel portion.

Figure 6:
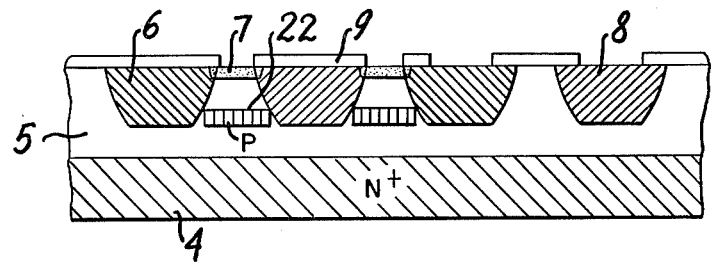
FIG. 6 is a sectional view of SITL according to this invention.
Figure 7A:
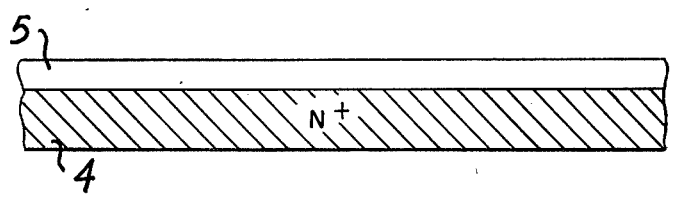
FIGS. 7a–7g show the fabrication processes of SITL according to this invention.
Figure 7B:
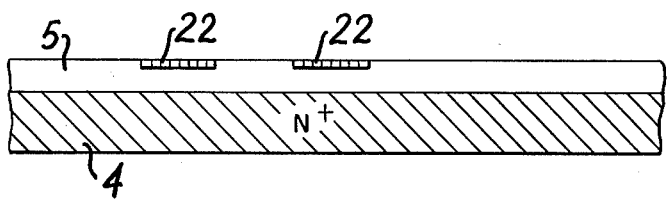
Figure 7C:
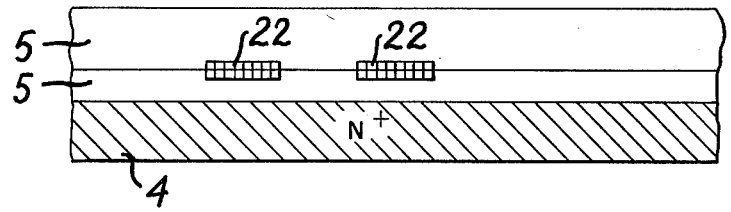
Figure 7D:
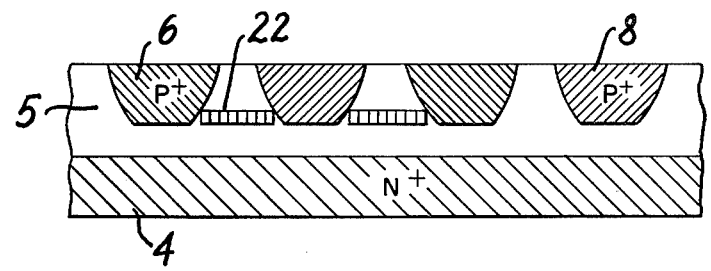
Figure 7E:
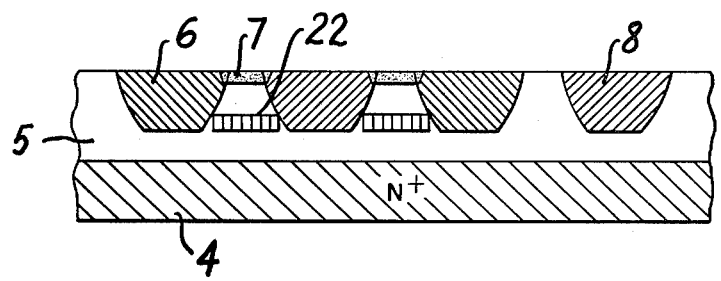
Figure 7F:
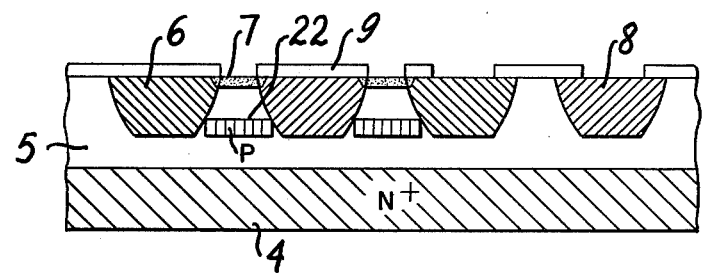
Figure 7G:
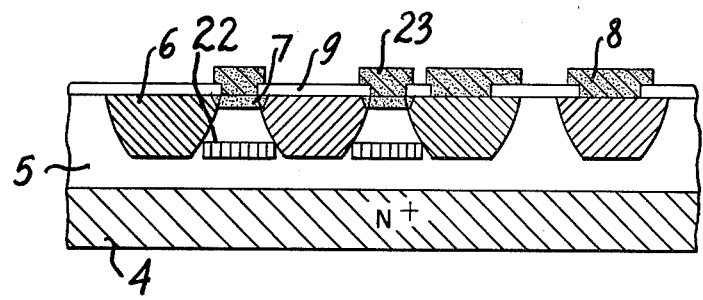

FIG. 6 illustrates the preferred embodiment of the present invention. This structure includes the P-regions 22 added in the conventional structure of SITL. The P-regions 22 formed in a channel portion of SIT define a barrier to electrons which flow from the N+ source 4 to the drain 7 and are effective to decrease I$_{DS}$. And though this structure makes also OFF-current decrease, and simultaneously makes the ON-current decrease, it is able to insure the sharp rise of I$_{DS}$ as shown at 18 of the FIG.5, if the recombination of holes is prevented by making the concentration of the P-regions 22 low and by making the P-regions 22 thin.

Hereafter, one of the fabricating processes of the structure of this invention will be described. In the first place, the epitaxial layer 5 is formed on the N+ substrate 4, (see FIG. 7 (A)). Secondly, the p-type impurities 22 are thinly deposited in the portion which will form the channel (FIG. 7 (B)). And then the epitaxial layer 5 is once more grown so as to cover the P-regions 22 (see FIG. 7 (C)). And next, the P+ regions for the gates of the SIT and the emitter 8 of the injector are fabricated by diffusion (see FIG. 7 (D)). At this fabricating process, the P+ regions 6 and 8 may be fabricated by ion implantation method to prevent expanding of the P-regions 22 in the channel by diffusion. Next, the N+ regions 7 are thinly diffused, (see FIG. 7 (E)). Thereafter, the apertures for evaporating the electrodes are opened in the oxide film 9 to make contacts (see FIG. 7 (F)). And finally, the electrodes (made, for example, of Al) 23 are evaporated thereon to perform the wiring operations.

I claim:

1. In a static induction transistor having a channel region formed between a drain region and a source region, and a gate region formed around said drain region and responsive to a gate voltage applied thereto for controlling current flowing from said drain region through said channel region to said source region, the improvement which comprises: an impurity region formed within said channel region and having a conductivity type opposite that of said channel region, wherein said impurity region has a thickness in the direction of current flow and an impurity concentration effective for decreasing the current when said gate region is biased by a low level gate voltage.

2. A static induction transistor according to claim 1, wherein said impurity region is a thin layer within said channel region and remote from both said source region and said drain region.

3. A static induction transistor according to claim 1, wherein said impurity region is a thin layer within said channel region, remote from both said source region and said drain region, and extending completely across said channel region so as to contact said gate region.

4. A static induction transistor according to claim 1, further comprising: an injector transistor having a base region and an emitter region, wherein said gate region of the static induction transistor defines a collector region of said injector transistor.

5. A static induction transistor according to claim 1, wherein said impurity region is formed from the same impurity as that of said gate region.

6. A static induction transistor according to claims 1 or 5, wherein said gate region is pinched off when said gate region is unbiased.

* * * * *